United States Patent
Kawakita et al.

(10) Patent No.: US 7,131,436 B2
(45) Date of Patent: Nov. 7, 2006

(54) ENGINE IGNITION SYSTEM HAVING NOISE PROTECTION CIRCUIT

(75) Inventors: Haruo Kawakita, Okazaki (JP); Koji Ando, Kariya (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 11/194,581

(22) Filed: Aug. 2, 2005

(65) Prior Publication Data

US 2006/0027220 A1 Feb. 9, 2006

(30) Foreign Application Priority Data

Aug. 6, 2004 (JP) ............................. 2004-230894

(51) Int. Cl.
*F02P 3/055* (2006.01)
(52) U.S. Cl. ...................... 123/630; 123/651; 123/656; 361/91.6
(58) Field of Classification Search ................ 123/630, 123/651, 652, 655, 656; 361/91.5, 91.6
See application file for complete search history.

(56) References Cited

U.S. PATENT DOCUMENTS

| | | | | |
|---|---|---|---|---|
| 4,099,998 A | * | 7/1978 | Ferro et al. | 438/545 |
| 5,915,367 A | * | 6/1999 | Oishi et al. | 123/651 |
| 6,495,863 B1 | * | 12/2002 | Narazaki | 257/106 |
| 6,539,929 B1 | * | 4/2003 | Ito et al. | 123/630 |
| 6,595,194 B1 | * | 7/2003 | Ito et al. | 123/644 |
| 6,717,412 B1 | * | 4/2004 | Moritz et al. | 324/380 |
| 2002/0145843 A1 | * | 10/2002 | Parada et al. | 361/91.5 |

FOREIGN PATENT DOCUMENTS

JP 10-274142 10/1998

* cited by examiner

Primary Examiner—T. M. Argenbright
(74) Attorney, Agent, or Firm—Nixon & Vanderhye, P.C.

(57) ABSTRACT

An ignition system for an internal combustion engine is connected to an ignition coil and to a circuit for providing an ignition signal. The ignition system includes a switch circuit connected to the ignition coil that switches on or off current supplied to the ignition coil, a control circuit that controls the switch circuit based on the ignition signal and a protection circuit that includes a pair of back-to-back connected zener diodes connected between the input terminal of the control circuit and a ground.

10 Claims, 6 Drawing Sheets

FIG. 5A
FIG. 5B
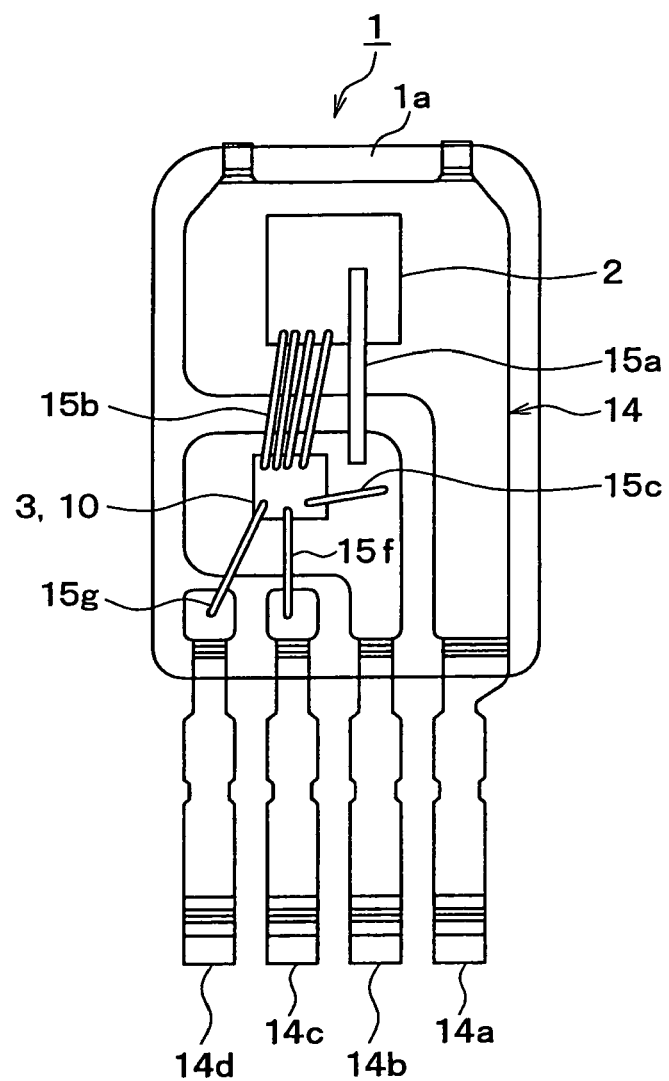
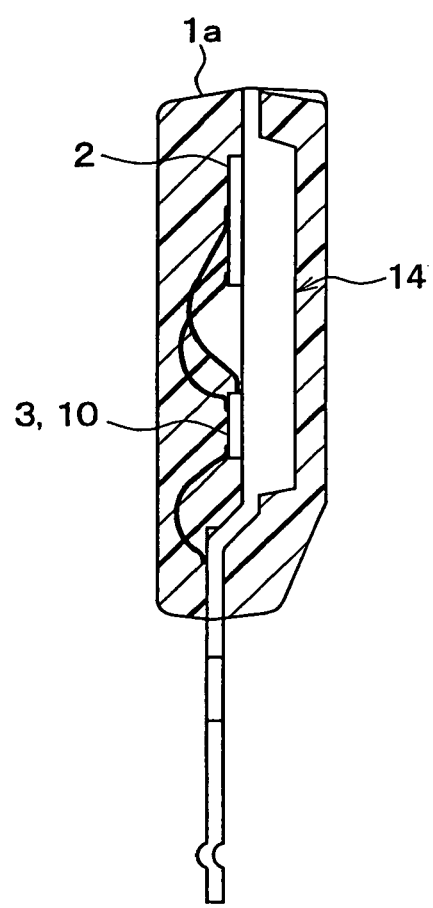

ENGINE IGNITION SYSTEM HAVING NOISE PROTECTION CIRCUIT

CROSS REFERENCE TO RELATED APPLICATION

The present application is based on and claims priority from Japanese Patent Application 2004-230894, filed Aug. 6, 2004, the contents of which are incorporated herein by reference.

BACKGROUND OF THE INVENTION

1. Field of the Invention

The present invention relates to an ignition system for an internal combustion engine and, more particularly, an electronically controlled ignition system that includes a power switching element, an integrated control circuit (IC) and a protection circuit that protects the ignition system from extraneous electric surges.

2. Description of the Related Art

JP-A 10-274142 discloses an engine ignition system in which current supply to an ignition coil is controlled by a control integrated circuit (hereinafter referred to as the control IC) to control ignition timing. In such an ignition system, a zener diode is provided to protect the control IC from extraneous surges. The zener diode is connected to an input terminal of the control IC at its cathode and to a ground at its anode. If an extraneous surge comes to the ignition system, the zener diode bypasses the surge and prevents it from getting into the control IC.

Recently, there is a tendency to mount an ignition coil in each plug hole of an internal combustion engine. As shown in FIG. 7 of the present application, the ground terminal of an ignition system J1 is connected to an engine body J2, the ground terminal of an ECU (engine control unit) J3 for driving the ignition system J1 is connected to a vehicle body J6 (vehicle GND), the ground terminal of a starter J4 is connected to the engine body J4 (engine GND), and the negative terminal of a battery J5 is connected to the vehicle body J6 (vehicle GND). When starting current is supplied to the starter J4 from the battery J5 as indicated by curve A, a considerable voltage drop is generated between the engine body J2 (engine GND) and the vehicle body (vehicle GND) J6. In this case, the zener diode can not prevent a large amount of current flowing in the forward direction thereof caused by the voltage drop, which may result in failure of the control IC.

Further, the distance between the ignition coil J1 and the ECU J3 becomes longer, so that the length connecting wires connecting the ignition coil J1 and the ECU J3 increases. As a result, the stray capacitance of the connecting wires may cause fluctuation of the signals on the input terminal, which may cause a malfunction of the ignition system.

SUMMARY OF THE INVENTION

Therefore, an object of the present invention is to solve the above described problem.

Another object of the invention is to provide an ignition system that prevents malfunctions caused by the voltage drop due to a difference in grounding between the ignition system and the ECU or engine control unit.

According to a feature of the present invention, an ignition system for an internal combustion engine to be connected to an ignition coil includes a switch circuit to switch on or off current supplied to the ignition coil, a control circuit for providing a control signal for controlling the switch circuit based on an ignition signal and a protection circuit that includes a pair of back-to-back connected zener diodes.

Because of the above feature, even if a voltage difference exists between two grounding members, such as an engine and a vehicle body, the pair of back-to-back connected zener diodes prevents current caused by the voltage difference from flowing into the control circuit. This prevents fluctuation of the ignition signal and malfunction of the ignition system.

In this ignition system: the control circuit and protection circuit may be formed in a single chip; the switch circuit and control circuit may be formed in a single chip; the back-to-back connected zener diodes may be p-n junction diodes made of polysilicon whose cathodes are connected to each other; or the p-n junction diodes may be made by means of impurity diffusing.

In the above ignition system, the control circuit preferably includes a wave-form shaping circuit for shaping the ignition signal and a gate driving circuit for converting the output signal of said wave-form shaping circuit into a signal having a high level and a low level.

In this ignition system: the switch circuit may include an IGBT having a gate connected to the gate driving circuit and a collector to be connected to the ignition coil; or the wave-form shaping circuit may include a comparator having a pair of input terminals one of which is connected to said protection circuit and the other of which is connected to a ground and an output terminal connected to the gate driving circuit.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

FIG. 5A illustrates a layout of parts and components of a variation of the ignition system according to the preferred embodiment, and FIG. 5B is a cross sectional view thereof;

DETAILED DESCRIPTION OF THE PREFERRED EMBODIMENTS

An ignition system according to a preferred embodiment of the present invention will be described with reference to FIGS. 1 and 2.

Figure 1:
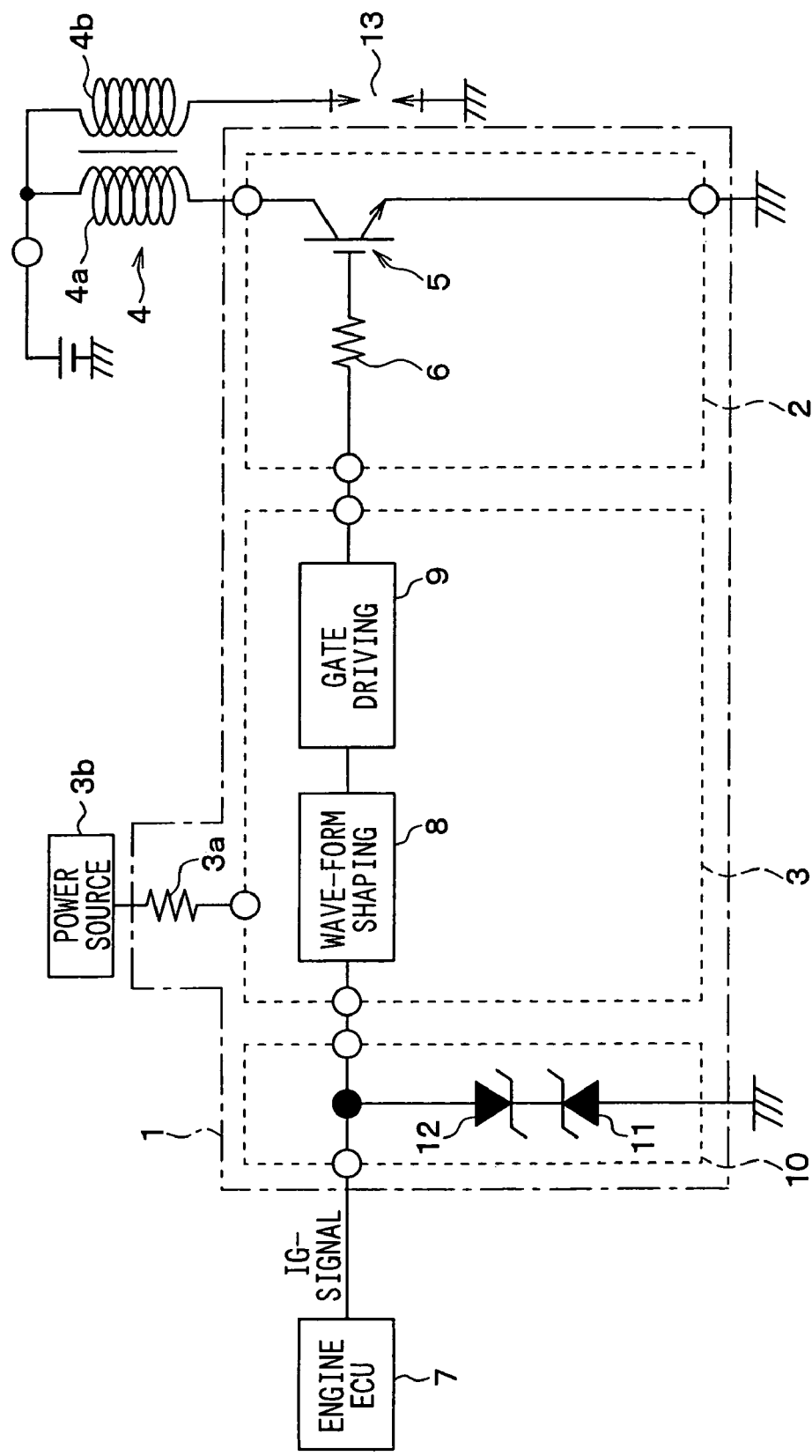
FIG. 1 is a circuit diagram of an ignition system according to a preferred embodiment of the invention.

As shown in FIG. 1, the ignition system 1 includes an integrated switching circuit (hereinafter referred to as the switch IC) 2 and an integrated control circuit (hereinafter referred to as the control IC) 3 and a protection circuit 10. The ignition system 1 is connected to an ignition coil 4 that supplies ignition sparks to a spark plug 13. The ignition coil 4 includes a primary coil 4a connected to the switch IC 2 and a secondary coil 4b connected to the spark plug 13.

The switch IC 2 and the control IC 3 are respectively formed on separate chips that are connected to each other by wires. The switch IC 2 includes an insulated gate bipolar transistor (hereinafter referred to the IGBT) 5 and an input resistor 6 to switch on or off electric current supplied to the primary coil 4a of the ignition coil 4. The IGBT 5 has a collector connected to the primary coil of the ignition coil 4, an emitter connected to a ground and a base connected to the input resistor 6. The input resistor 6 is a resistor to limit input current flowing through the gate of the IGBT 5.

When a high level gate voltage is supplied by the control IC 3 to the gate of the IGBT 5 through the series resistor 6, the IGBT 5 turns on to supply electric current to the primary coil 4a. The IGBT turns off to cut the electric current when a low level gate voltage is supplied by the control IC 3 to the gate of the IGBT 5.

The control IC 3 is powered by an electric power source 3b via a protection resistor 3a. The control IC 3 includes a wave-form shaping circuit 8 and a gate driving circuit 9. The control IC 3 forms the gate voltage, which controls the IGBT 5, from an ignition signal that is sent from an engine control unit (hereinafter referred to as the engine ECU) 7. In more detail, the wave form of the ignition signal that is sent to the control IC 3 is shaped by the wave-form shaping circuit 8 and is converted by the gate driving circuit 9 into high or low level gate driving signal to be applied to the gate of the IGBT 5.

The protection circuit 10 is connected to the input terminal of the wave-form shaping circuit 8. The protection circuit 10 includes a pair of back-to-back connected zener diodes 11 and 12, which are p-n junction diodes made of polysilicon whose cathodes are connected to each other. The p-n junction diodes may be made by means of impurity diffusing.

Figure 2:
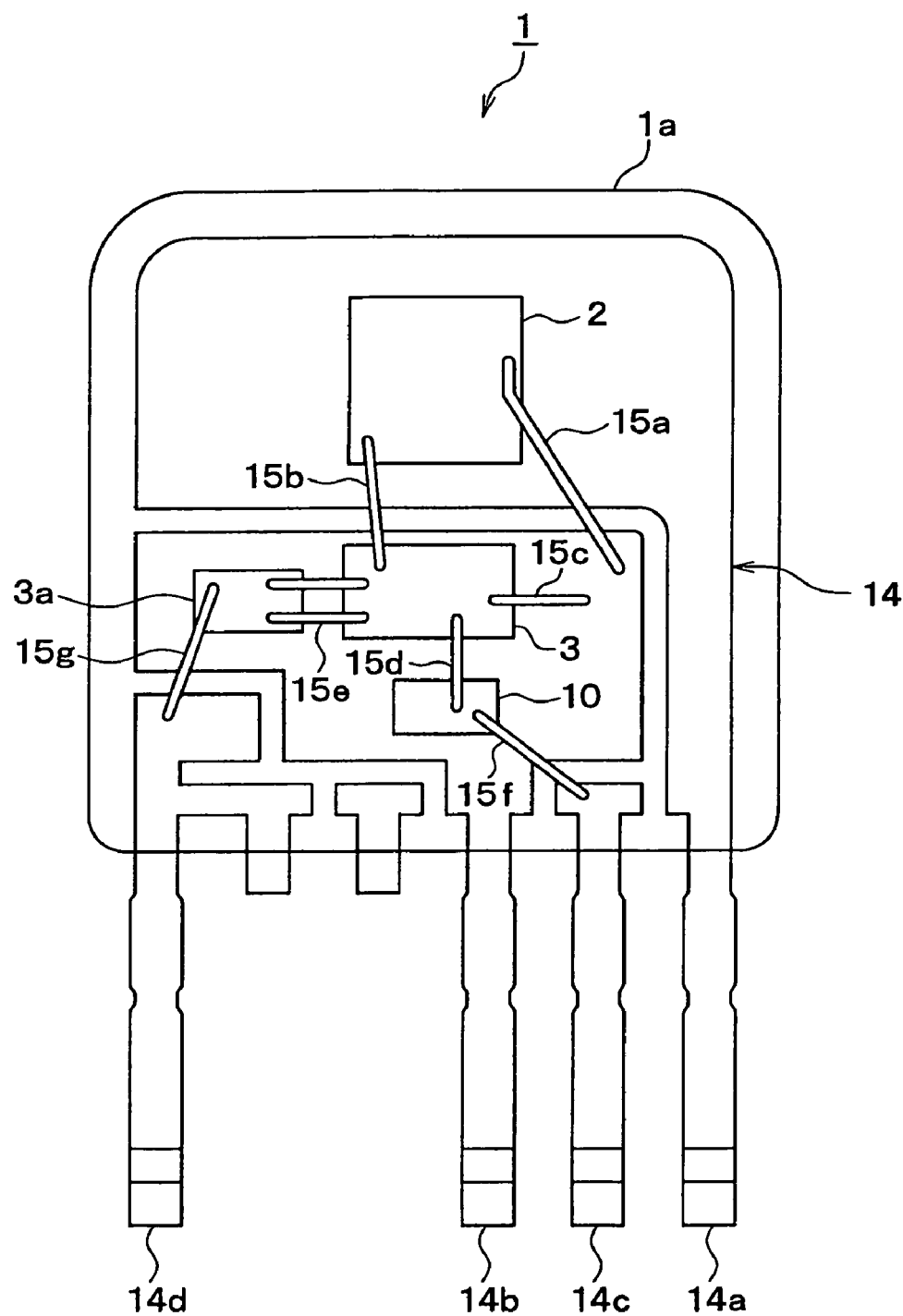
FIG. 2 is a schematic diagram illustrating a layout of parts and components of the ignition system according to the embodiment.

As shown in FIG. 2, the ignition system 1 is formed in a lead frame 14 and covered with a resinous coat 1a. The switching IC 2 is mounted on a portion of an output terminal 14a that is to be connected to the ignition coil's primary coil 4a. The control IC 3, the protection circuit 10 and the protection resistor 3a are mounted on portions of a GND (ground) terminal 14b, which is to be connected to an engine body (engine GND). The switching IC 2 is connected by a bonding wire 15a to the GND terminal 14b and connected by a bonding wire 15b to the control IC 3, which is connected by a bonding wire 15c to the GND terminal 14b. The control IC 3 is also connected to the protection circuit 10 by another bonding wire 15d and to the protection resistor 3a. The protection circuit 10 is connected by a bonding wire 15f to an input terminal 14c that receives ignition signals sent from the engine ECU 7. The protection resistor 3a is connected by a bonding wire 15g to a constant voltage (+B) terminal 14d that is to be connected to the electric source 3b.

The above-described ignition system is connected to the primary coil 4a of the ignition coil 4 at the collector of the IGBT 5 and to the engine ECU 7 at the input terminal 14c.

When a high level ignition signal is received from the engine ECU 7, a high gate voltage is applied to the gate of the IGBT 5 to turn on. Accordingly, current flows to the primary coil 4a through the emitter-collector path of the IGBT 5 until the amount of the current increases to a preset value. When a low level ignition signal is received from the engine ECU 5, the IGBT 5 turns off to cut the current flowing through the primary coil 4a, so that the secondary coil 4b of the ignition coil 4 generates a high ignition voltage.

Because the protection circuit 10 includes a pair of back-to-back connected zener diodes 11 and 12, noise current can be prevented even if the voltage difference is generated between the engine GND and the vehicle GND when a starter motor is operated. This prevents malfunction of the control IC 3. The pair of back-to-back connected zener diodes 11-and 12 can be replaced with a pair of back-to-back connected thyristors. In this case, the thyristors are arranged to turn on when voltage acrossthe pair of back-to-back connected thyristors becomes higher than a preset value.

Figure 3:
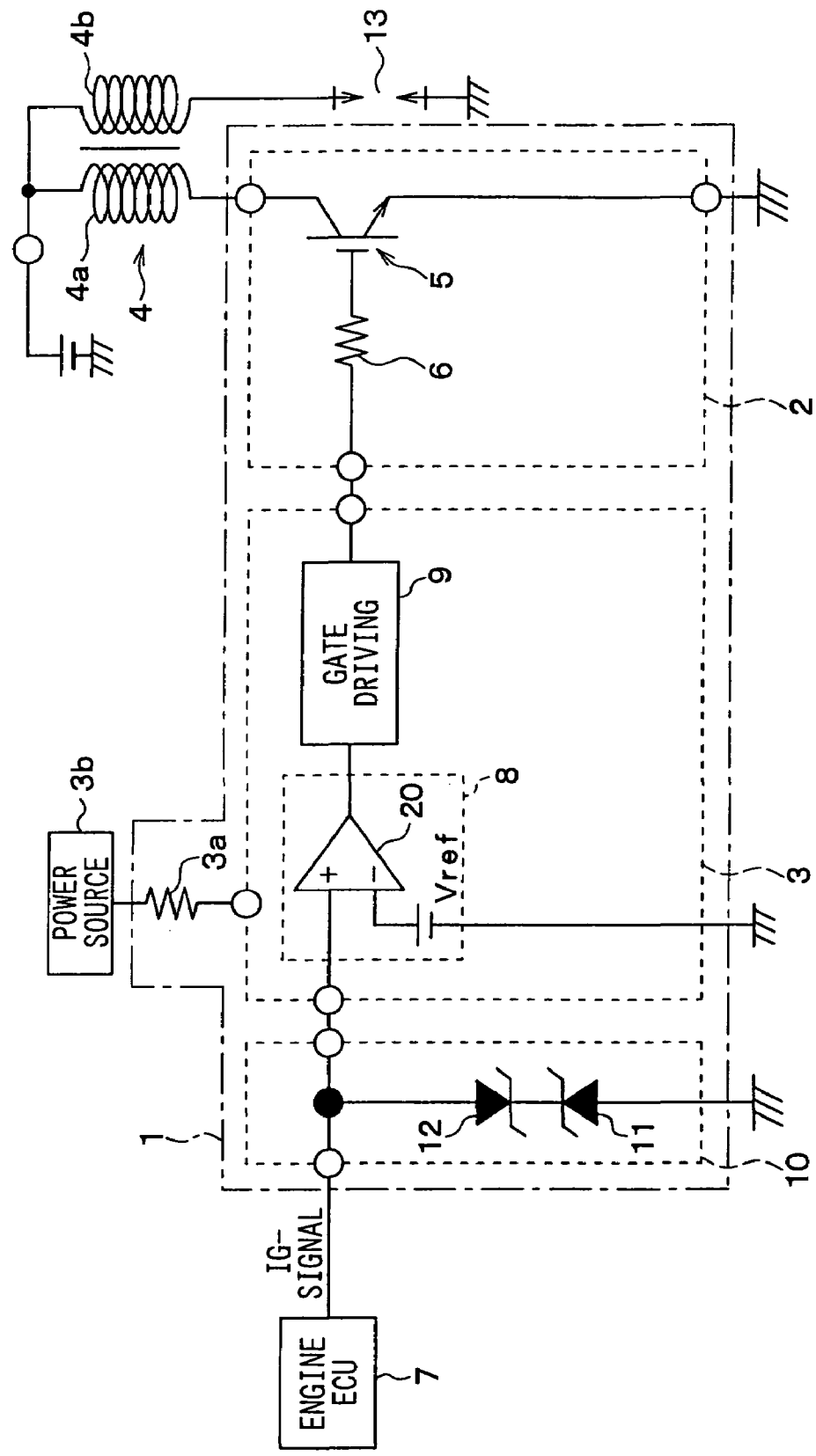
FIG. 3 is a circuit diagram of a variation of the ignition system according to the preferred embodiment of the invention.
Figure 4:
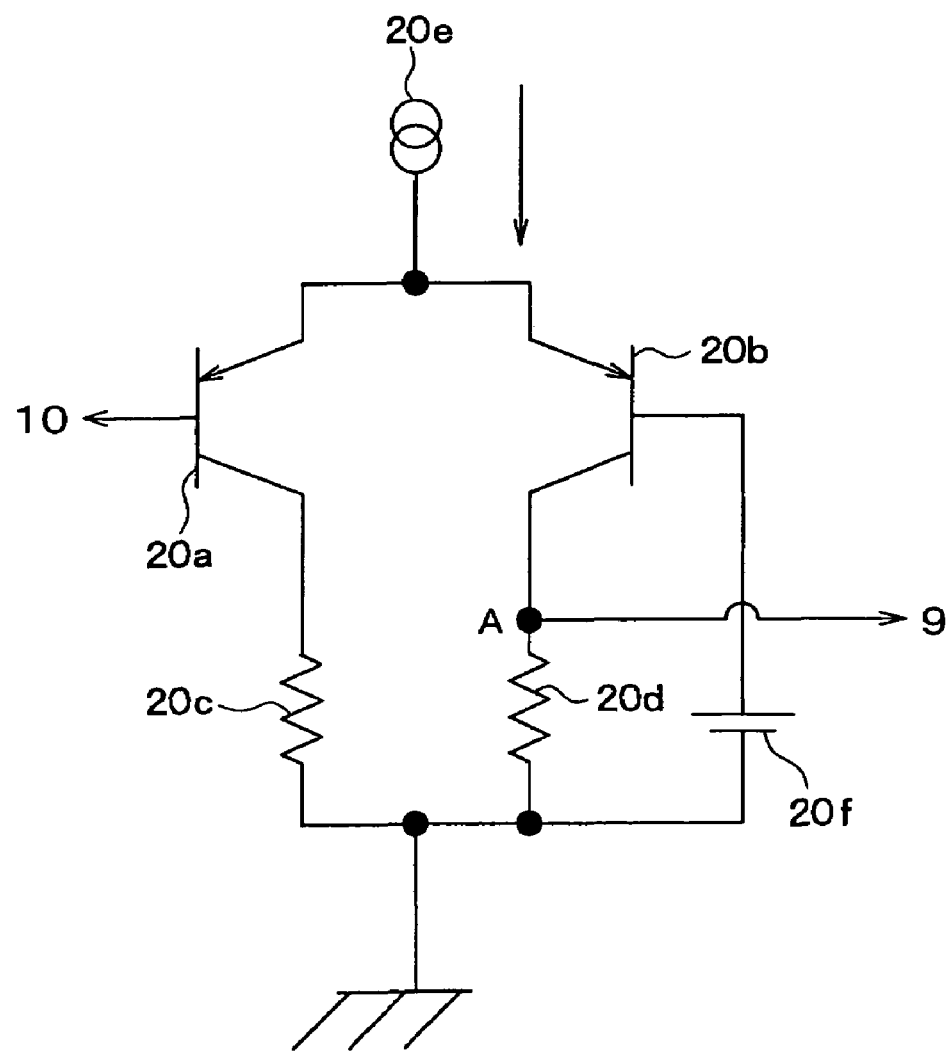
FIG. 4 is a circuit diagram of a comparator which is included in a wave-form shaping circuit.

As shown in FIG. 3, the wave-form shaping circuit 8 may include a comparator 20. The comparator 20 is comprised of a pair of bipolar PNP transistors 20a, 20b, resistors 20c, 20d, a constant current source 20e and a gate driving electric source 20f. The transistor 20a and the resistor 20c are connected in series, and the transistor 20b and the resistor 20d are connected in series. The transistors 20a, 20b are parallelly connected to the constant current source 20e, so that the ignition signal is applied to the gate the transistor 20a and the output signal of the comparator is provided at a joint A of the collector of the transistor 20b and the resistor 20d.

When the level of the ignition signal becomes low, the PNP transistor 20a turns on to turn off the PNP transistor 20b. Accordingly, the potential of the joint A becomes low to turn off the IGBT 5. When the level of the ignition signal becomes high, the PNP transistor 20a turns off to turn on the PNP transistor 20b. Accordingly, the potential of the joint A becomes high to turn on the IGBT 5.

The bipolar PNP transistors 20a, 20b switch from the turn-off state to the turn-on state very quickly and switch from the turn-on state to the turn-off state slowly. If high frequency noises are included in the ignition signal to increase the voltage level of the ignition signal, the PNP transistor 20a does not turn off due to such a quick and instantaneously increasing and decreasing ignition signal. This prevents an erroneous operation of the ignition system 1 due to high frequency noises.

The protection circuit 10 and the control IC 3 can be formed on a single chip, as shown in FIGS. 5A and 5B. The switch IC 2 can be also integrated with the control IC 3.

Figure 6:
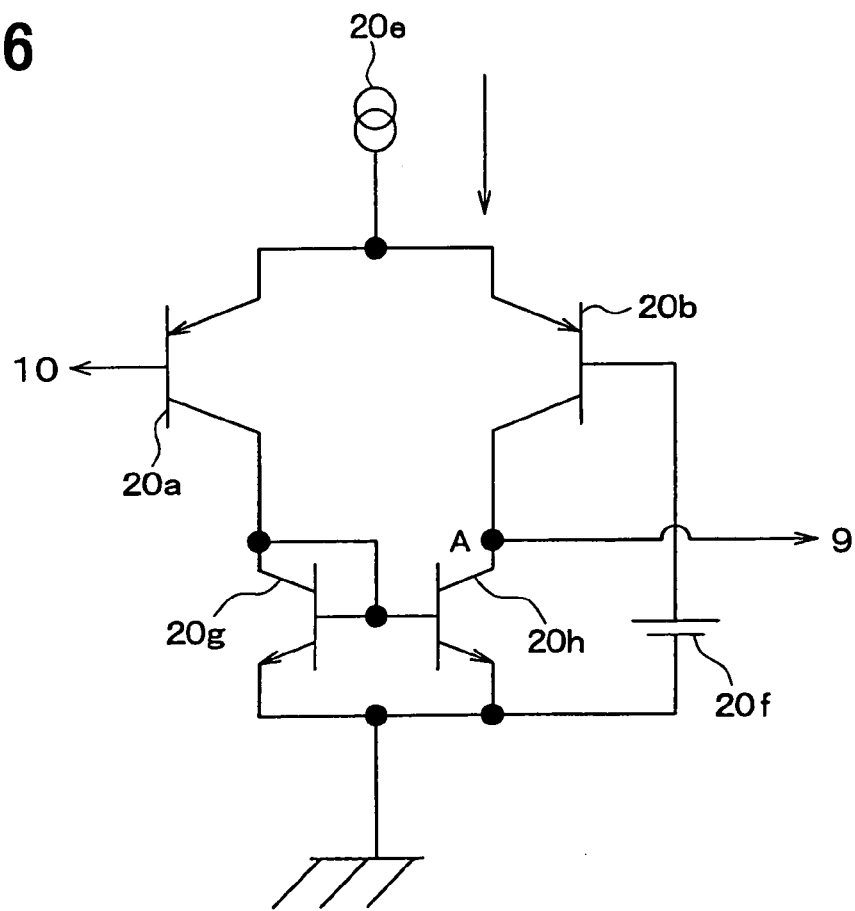
FIG. 6 is a circuit diagram of a variation of the comparator shown in FIG. 4
Figure 7:
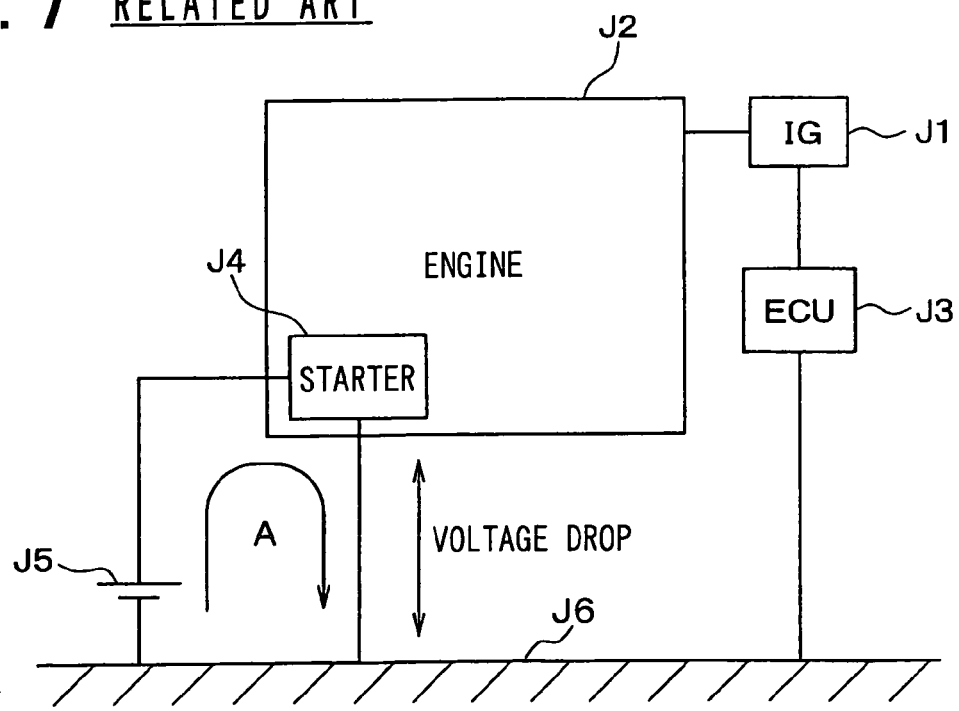
FIG. 7 is a schematic diagram illustrating various components or equipments whose ground terminal is connected to an engine or a vehicle body.

The comparator 20 that includes resistors 20c, 20d may be replaced with another comparator shown in FIG. 6. This comparator includes a current mirror circuit of a pair of NPN transistors 20g, 20h instead of the resistors 20c, 20d.

In the foregoing description of the present invention, the invention has been disclosed with reference to specific embodiments thereof. It will, however, be evident that various modifications and changes may be made to the specific embodiments of the present invention without departing from the scope of the invention as set forth in the appended claims. Accordingly, the description of the present invention is to be regarded in an illustrative, rather than a restrictive, sense.

What is claimed is:

1. An ignition system for an internal combustion engine to be connected to an ignition coil and a circuit means for providing an ignition signal, said ignition system comprising:

a switch circuit formed in a first chip to be connected to the ignition coil to switch on or off current supplied to the ignition coil;

a control circuit for providing a control signal for controlling said switch circuit based on the ignition signal; and a protection circuit including an input terminal that receives the ignition signal from the circuit means, a pair of back-to-back connected zener diodes connected between the input terminal and a ground;

wherein the control circuit is formed in a second chip that is separate from the first chip.

2. The ignition system as claimed in claim 1, wherein said back-to-back connected zener diodes are p-n junction diodes made of polysilicon whose cathodes are connected to each other.

3. The ignition system as claimed in claim 1, wherein said back-to-back connected zener diodes are p-n junction diodes made by means of impurity diffusing.

4. An ignition system for an internal combustion engine to be connected to an ignition coil and a circuit means for providing an ignition signal, said ignition system comprising:

a switch circuit connected to the ignition coil to switch on or off current supplied to the ignition coil;

a control circuit for providing a control signal for controlling said switch circuit based on the ignition signal; and a protection circuit including an input terminal that receives the ignition signal from the circuit means, a pair of back-to-back connected zener diodes connected between the input terminal and a ground;

wherein said control circuit includes a wave-form shaping circuit for shaping the ignition signal and a gate driving circuit for converting the output signal of said waveform shaping circuit into a signal having a high level and a low level.

5. The ignition system as claimed in claim 4, wherein said switch circuit includes an IGBT having a gate connected to said gate driving circuit and a collector to be connected to the ignition coil.

6. The ignition system as claimed in claim 4, wherein said wave-form shaping circuit includes a comparator having a pair of input terminals one of which is connected to said protection circuit and the other of which is connected to a ground and an output terminal connected to said gate driving circuit.

7. The ignition system as claimed in claim 6, wherein said comparator comprises a pair of parallelly connected NPN transistors one of which has a base connected to said protection circuit and a collector connected to the ground and the other of which has a collector connected to said gate driving circuit.

8. An ignition system for an internal combustion engine to be connected to an ignition coil and a circuit means for providing an ignition signal, said ignition system comprising:

an IGBT circuit formed in a first chip to be connected to the ignition coil to switch on or off current supplied to the ignition coil;

a control IC circuit having an input terminal formed in a second chip that is separate from the first chip to receive the ignition signal and an output terminal for providing a control signal for controlling the switching operation of said IGBT circuit according to the ignition signal; and a pair of back-to-back connected semiconductor elements connected between the input terminal of said control IC and a ground, wherein said pair of back-to-back connected semiconductor elements prevents current flowing through them if a voltage difference between the input terminal of said control IC and the ground is lower than a prescribed voltage and allows the current flowing through them if the voltage difference between the input terminal of said control IC and the ground is higher than the prescribed voltage.

9. An ignition system for an internal combustion engine to be connected to an ignition coil and a circuit for providing an ignition signal, said ignition system comprising:

a switch circuit connected to the ignition coil to switch on or off current supplied to the ignition coil;

a control circuit for providing a control signal for controlling said switch circuit based on the ignition signal, said control circuit including a circuit for keeping said switch circuit turned-off when the voltage level of the ignition signal increases due to high frequency noises; and a protection circuit including an input terminal that receives the ignition signal from the circuit for providing the ignition signal, and a pair of back-to-back connected zener diodes connected between the input terminal and a ground.

10. An ignition system for an internal combustion engine to be connected to an ignition coil and a circuit for providing an ignition signal, said ignition system comprising:

an IGBT circuit connected to the ignition coil to switch on or off current supplied to the ignition coil;

a control IC circuit having an input terminal for receiving the ignition signal and an output terminal for providing a control signal for controlling the switching operation of said IGBT circuit according to the ignition signal; and a pair of back-to-back connected semiconductor elements connected between the input terminal of said control IC and a ground, wherein said pair of back-to-back connected semiconductor elements prevents current flowing through them if a voltage difference between the input terminal of said control IC and the ground is lower than a prescribed voltage and allows the current flowing through them if the voltage difference between the input terminal of said control IC and the ground is higher than the prescribed voltage, and wherein said control IC circuit comprises a circuit, connected to said back-to-back connected semiconductor elements, for keeping said IGBT circuit turned-off when the voltage level of the ignition signal increases due to high frequency noises.

* * * * *